United States Patent
Wu et al.

(10) Patent No.: US 11,223,330 B1
(45) Date of Patent: Jan. 11, 2022

(54) DYNAMIC SUPPRESSION OF POP AND CLICK NOISE IN AN AUDIO DRIVER

(71) Applicant: Nuvoton Technology Corporation, Hsinchu (TW)

(72) Inventors: Chang-Xian Wu, San Jose, CA (US); Bal S. Sandhu, Fremont, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/926,544

(22) Filed: Jul. 10, 2020

(51) Int. Cl.
   *H03F 1/30* (2006.01)
   *H03F 3/187* (2006.01)
   *H03F 3/45* (2006.01)

(52) U.S. Cl.
   CPC ............. *H03F 1/305* (2013.01); *H03F 3/187* (2013.01); *H03F 2200/03* (2013.01)

(58) Field of Classification Search
   CPC ....... H03F 1/305; H03F 3/187; H03F 2200/03
   USPC ........................................ 330/10, 207 A, 251
   See application file for complete search history.

(56) References Cited

U.S. PATENT DOCUMENTS 7,224,218 B1 * 5/2007 Jiang .................... H03F 1/305
                                                    327/132

* cited by examiner

*Primary Examiner* — Hieu P Nguyen
(74) *Attorney, Agent, or Firm* — Kilpatrick Townsend & Stockton LLP

(57) ABSTRACT

An output driver for an audio system includes a pre-charge circuit. The pre-charge circuit includes a charging amplifier and a feedback bias circuit. A charging amplifier includes an output node for coupling to a capacitive load, a first input node for receiving a reference voltage, a second input node for coupling to the output node of the charging amplifier, and a bias node for receiving a bias current. An output current of the charging amplifier varies with the bias current. The feedback bias circuit is coupled to the output node to sense an output voltage of the charging amplifier, and configured to provide the bias current that varies with the output voltage of the charging amplifier.

19 Claims, 8 Drawing Sheets

| Conditions: Typical, 27C, 3.3V | | | |
|---|---|---|---|
| Ib<1:0> | R | THD (dB) | rise time (90%) |
| 0 | 75K | -91 | 253mS |
| 1 | 70K | -91 | 236mS |
| 2 | 65K | -90.7 | 220mS |
| 3 | 60K | -90.5 | 201mS |

FIG. 7

DYNAMIC SUPPRESSION OF POP AND CLICK NOISE IN AN AUDIO DRIVER

BACKGROUND OF THE INVENTION

The invention relates to the field of audio amplifiers. In particular, embodiments of the invention are directed to reducing or eliminating pop and click noise in an audio playback system. However, the circuit and methods described here can be used in other applications for improved charging of a load device.

The pop and click noise can be generated when the playback system is first turned on or turned off and when the source driver charges or discharges too quickly due to improper equalization and can damage the headphone speakers.

Conventional solutions to reduce pop and click noise often suffer from numerous shortcomings. These shortcomings can include complicated circuits, large chip area, noise generation, and insufficient accuracy. These shortcomings are described below in more detail, and improved methods and circuit examples are described below.

BRIEF SUMMARY OF THE INVENTION

Embodiments of the present invention provide methods and apparatus for pre-charging the output of an audio amplifier in a smooth and efficient manner to minimize pop and click noise by controlling the bias current in the charging amplifier. The method senses the output voltage by a feedback amplifier to monitor and auto-track the output voltage and adjusts the bias current of the charging amplifier according to the output voltage. The method can control the charging time with a programmable resistor to set the bias current of the charging amplifier in accordance with the capacitive load and the desired rise time. The method can also create a deliberate input offset on a differential amplifier used in the closed-loop feedback to bias the gate voltage of a NMOS pass transistor such that the transistor is biased in the sub-threshold region.

According to some embodiments of the present invention, an output driver for an audio system includes a driving amplifier circuit for driving a capacitive load and a pre-charge circuit for pre-charging the capacitive load to a common mode voltage. The pre-charge circuit includes a charging amplifier, which includes an output node for coupling to a capacitive load, a first input node for receiving a reference voltage, a second input node for coupling to the output node of the charging amplifier, and a bias node for receiving a bias current. An output current of the charging amplifier varies with the bias current. The pre-charge circuit also includes a feedback bias circuit, which includes a first current source, a second current source, and a summing circuit. The first current source includes a first transistor and a feedback amplifier. The feedback amplifier includes an output node coupled to a gate of the first transistor, a first input node for coupling to the output node of the charging amplifier, a second input node for coupling to a source of the first transistor, and a resistor for coupling to the source of the first transistor. The first current source is configured to provide a first current that varies with an output voltage of the charging amplifier, and the second current source for providing a second current. The summing circuit includes first and second current mirrors for providing a bias current that represents a sum of the first current and the second current. The summing circuit is coupled to the bias node of the charging amplifier for providing the bias current to the charging amplifier.

In some embodiments of the above output driver, the feedback amplifier has a pre-set input offset configured to bias the first transistor weakly-on in a sub-threshold region.

In some embodiments, the output voltage of the charging amplifier varies proportionally to the bias current.

In some embodiments, the resistor is a programmable resistor configured to set the bias current of the charging amplifier in accordance with the capacitive load and desired rise time.

In some embodiments, the output driver further includes a switch circuit configured to couple the output node of the charging amplifier to either the capacitive load or a ground node.

In some embodiments, the charging amplifier and the feedback amplifier are operational amplifiers.

In some embodiments, the second current is an initial current characterized by a magnitude selected to provide an initial step of charging current.

According to some embodiments of the present invention, an output driver for an audio system includes a pre-charge circuit. The pre-charge circuit includes a charging amplifier and a feedback bias circuit. A charging amplifier includes an output node for coupling to a capacitive load, a first input node for receiving a reference voltage, a second input node for coupling to the output node of the charging amplifier, and a bias node for receiving a bias current. An output current of the charging amplifier varies with the bias current. The feedback bias circuit is coupled to the output node to sense an output voltage of the charging amplifier, and configured to provide the bias current that varies with the output voltage of the charging amplifier.

In some embodiments of the above output driver, the feedback bias circuit includes a first current source. The first current source includes a first transistor and a feedback amplifier. The feedback amplifier includes an output node coupled to a gate of the first transistor, a first input node for coupling to the output node of the charging amplifier, and a second input node for coupling to a source of the first transistor. The first current source also includes a resistor for coupling to the source of the first transistor. The first current source is configured to provide a first current that varies with the output voltage of the charging amplifier.

In some embodiments, the feedback bias circuit also includes a second current source for providing a second current and a summing circuit including first and second current mirrors for providing a bias current that represents a sum of the first current and the second current. The summing circuit is coupled to the bias node of the charging amplifier for providing the bias current to the charging amplifier. The pre-charge circuit is configured to provide an output current to the capacitive load at the output node of the charging amplifier. The output current varies with the output voltage at the output node.

In some embodiments, the second current is an initial current characterized by a magnitude selected to provide an initial step of charging current.

In some embodiments, the feedback amplifier has a pre-set input offset configured to bias the first transistor weakly-on in a sub-threshold region.

In some embodiments, the resistor is a programmable resistor configured to set the bias current of the charging amplifier in accordance with the capacitive load and desired rise time.

In some embodiments, an output current of the charging amplifier varies with the bias current.

In some embodiments, the output driver further includes a switch circuit configured to couple the output node of the charging amplifier to either the capacitive load or a ground node.

According to some embodiments of the present invention, a method is provided for pre-charging an output driver in an audio system. The method includes providing a charging amplifier, which includes an output node for coupling to a capacitive load, a first input node for receiving a reference voltage, a second input node for coupling to the output node of the charging amplifier, and a bias node for receiving a bias current. The method also includes sensing an output voltage of the charging amplifier, providing a first current based on the output voltage of the charging amplifier, coupling the first current to the bias node of the charging amplifier to provide the bias current, which varies with the output voltage, and charging the capacitive load with the output voltage of the charging amplifier.

In some embodiments, sensing the output voltage of the charging amplifier includes providing a feedback amplifier, coupling a first input node of a feedback amplifier to the output node of the charging amplifier, coupling a second input node of the feedback amplifier to a source of a first transistor, and coupling an output node of the feedback amplifier to a gate of the first transistor.

In some embodiments, providing the first current includes coupling a source node of the first transistor to a resistor.

In some embodiments, the method further includes providing a second current that is a programmable initial current.

In some embodiments, the method further includes coupling the second current to the bias node of the charging amplifier to provide an initial charging voltage step.

The following description, together with the accompanying drawings, provides further information of the nature and advantages of the claimed invention.

BRIEF DESCRIPTION OF THE DRAWINGS

FIG. 7 illustrates a table of performance data based on simulation for the pre-charge circuit of FIG. 4.

DETAILED DESCRIPTION OF THE INVENTION

Figure 1:
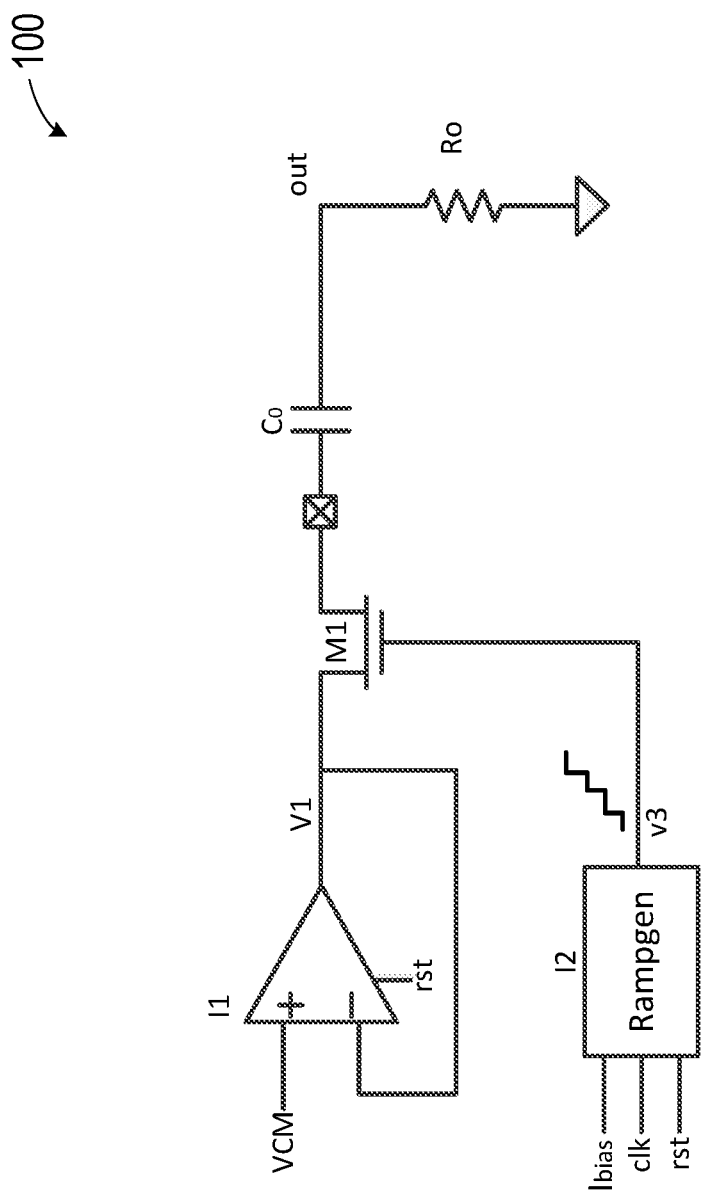
FIG. 1 is a simplified schematic diagram illustrating a lineout driver in a conventional audio system.

FIG. is a simplified schematic diagram illustrating a lineout driver in a conventional audio system. FIG. 1 illustrates a conventional method and apparatus for suppressing the pop and click noise. In this example, output driver 100 is a discrete sampled system and requires a clock signal (clk). Initially, the reset signal (rst) is high, which forces the voltage V1 to be pulled to ground. The circuit starts when the rst signal is turned off, which enables amplifier I1 to drive node V1 to VCM (common mode voltage). At the same time, the ramp generator Rampgen (I2) is turned on. Input Ibias is a bias current for the ramp generator Rampgen (I2). The output of the ramp generator then drives the gate of the NMOS transistor M1, and slowly pumps up the gate voltage on one step at a time on each clock pulse. The rise time on the output voltage depends on the size of the external DC blocking capacitor Co, and the load resistor Ro.

FIG. 1 is a discrete system that needs a clock to control a gate by a ramp generator to pre-charge the output capacitor to VCM (common mode voltage) in a controlled manner. One disadvantage with the scheme in FIG. 1 is that a clock signal is required for the ramp generator, which can cause clock coupling and increase the power dissipation. In addition, careful attention is required to minimize layout parasitics to prevent clock coupling on to the node voltage V1, which can show up as "pop or click" noise.

Figure 2:
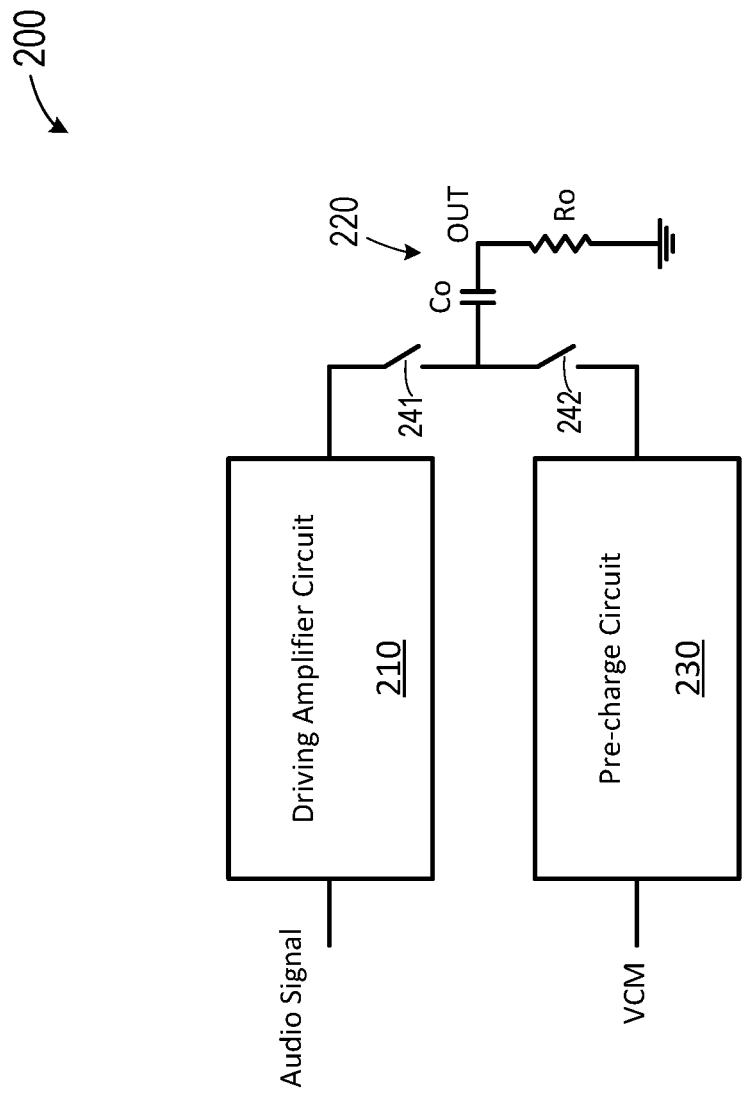
FIG. 2 is a simplified block diagram illustrating an audio driver circuit in an audio system according to some embodiments of the present invention.

FIG. 2 is a simplified block diagram illustrating an audio driver circuit in an audio system according to some embodiments of the present invention. FIG. 2, shows an audio driver circuit 200 for an audio system. Audio driver circuit 200 includes a driving amplifier circuit 210 for driving a capacitive load 220 and a pre-charge circuit 230 for pre-charging the capacitive load 220 to a reference voltage, e.g., a common mode voltage (VCM). The capacitive load 220 can include a capacitor Co and a resistor Ro at an output node OUT. The capacitor can be a coupling capacitor, and resistor Ro can represent a speaker.

In FIG. 2, audio driver circuit 200 also includes switches 241 and 242 for coupling to driving amplifier circuit 210 and pre-charge circuit 230. When switch 241 is turned off and switch 242 is turned on, pre-charge circuit 230 is enabled and driving amplifier circuit 210 is disconnected from the output. The pre-charge circuit takes over and charges the output to VCM. When the output is charged to VCM, the pre-charge circuit 230 is disconnected from the output and the driving amplifier circuit 210 takes over to start driving the audio signal to the output.

Figure 3A:
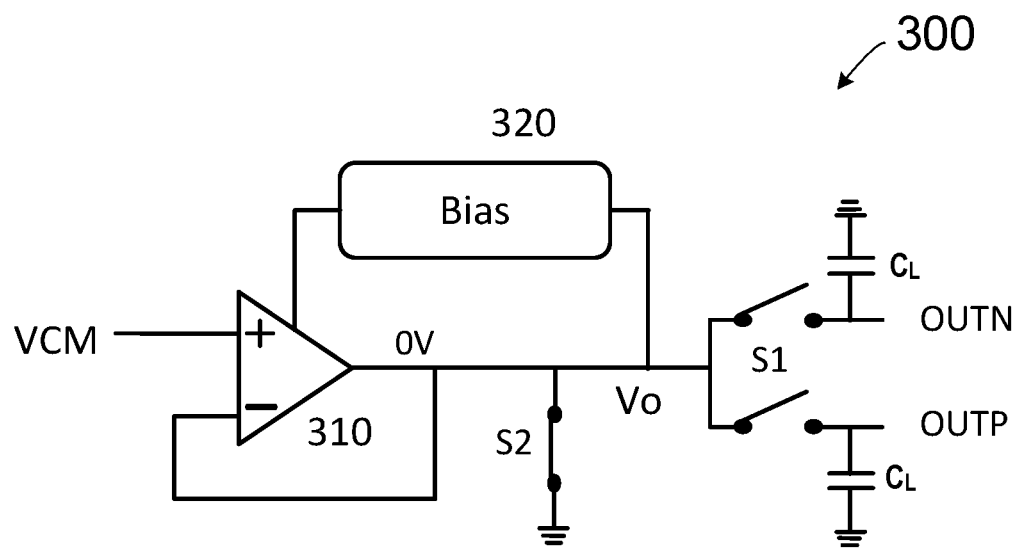
FIGS. 3A and 3B are simplified schematic diagrams illustrating a pre-charge circuit for an output driver in an audio system according to some embodiments of the present invention.
Figure 3B:
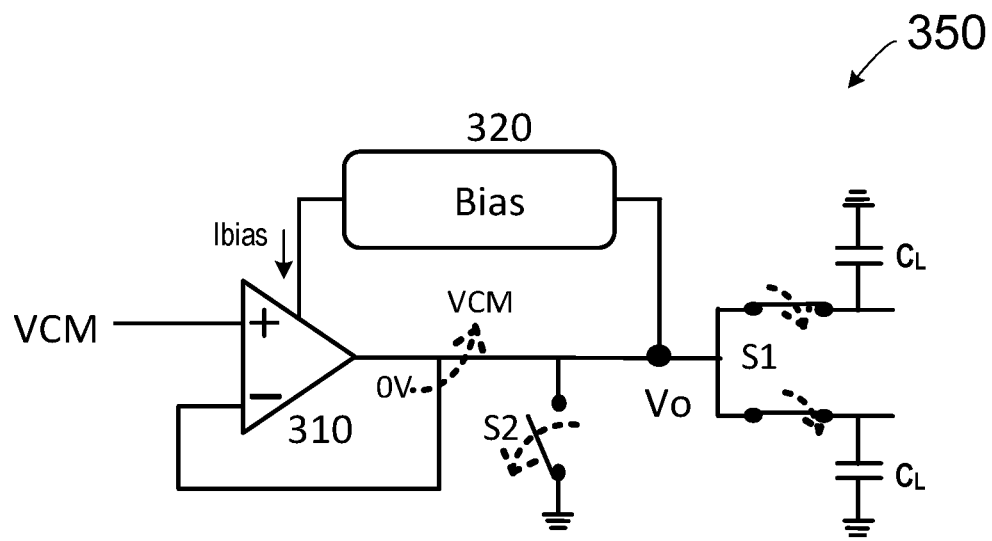

FIGS. 3A and 3B are simplified schematic diagrams illustrating a pre-charge circuit for an output driver in an audio system according to some embodiments of the present invention. FIG. 3A shows a pre-charge circuit 300 including a charging amplifier 310 and a feedback bias circuit 320. Pre-charge circuit 300 is an example of pre-charge circuits that can be used as pre-charge circuit 230 in audio driver 200, illustrated in FIG. 2. Pre-charge circuit 300 includes a continuous time feedback system and does not require a clock signal. This approach can avoid any clock coupling issues associated with the conventional system of FIG. 1. Pre-charge circuit 300 is configured to pre-charge the output to a reference voltage, for example, a common-mode voltage (VCM), in a smooth and efficient manner and avoid charging glitches, thereby minimizing the click and pop noise when an audio playback system is first turned on.

FIG. 3A also shows two switches, S1 and S2. Switch S1 is used to couple to an audio load, for example, a speaker, which is represented by a capacitor load $C_L$. Two connection options are shown, OUTN or OUTP. Switch S2 is used to couple to a ground node. FIG. 3A shows that the output Vo of pre-charge circuit 300 is coupled to the ground node, and the output voltage is at 0V. FIG. 3B shows a pre-charge circuit 350, which has the same circuit as pre-charge circuit 300 of FIG. 3A. However, in FIG. 3B, pre-charge circuit 350 is shown to be coupled to the output by the actions of switches S1 and S2. The output voltage Vo is shown to be charged to VCM. In some embodiments, switches S1 and S2 can be driven by a control circuit in the audio system.

Initially, as shown in FIG. 3A, to save power, amplifier 310 is disabled (powered-down) and the output Vo is at 0V. FIG. 3A shows the circuit in a disable mode configuration with switch S1 open and switch S2 closed. In FIG. 3B, at time t=0, the switch S1 is closed and switch S2 is opened. This starts the charging amplifier 310 to drive the output slowly towards the VCM voltage. The feedback bias circuit 320 continues to track the output voltage and adjusts the bias current $I_{bias}$ of the charging amplifier 310 to smoothly bring the output voltage Vo fully to VCM. In some audio systems, the VCM voltage can be set at the mid-value of the output supply voltage. For example, if the output supply voltage is 3.3V, then VCM=1.65V. In some embodiments, charging amplifier 310 can be a unit gain amplifier.

Figure 4:
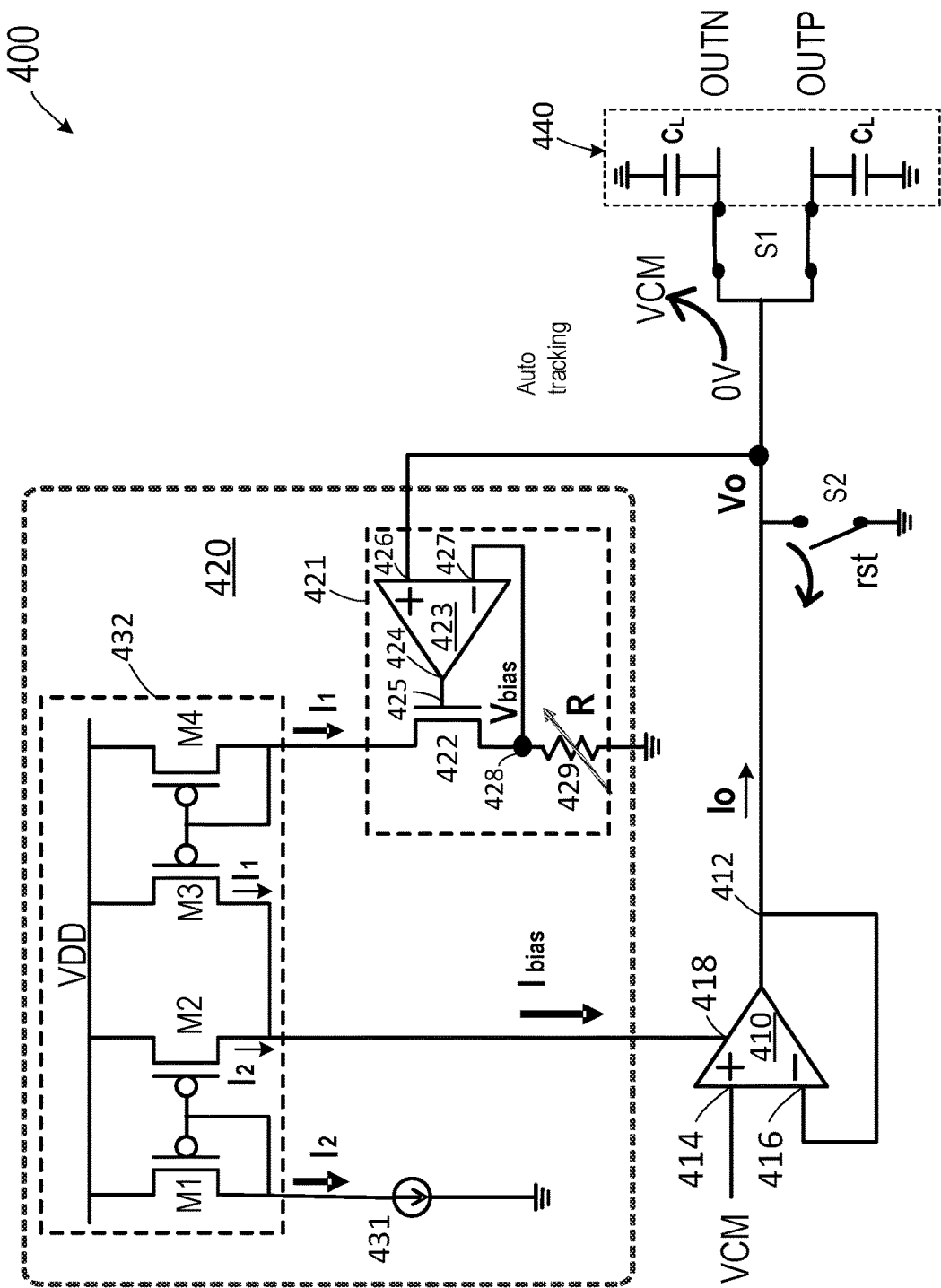
FIG. 4 is a simplified schematic diagram illustrating a pre-charge circuit for audio driver circuit in an audio system according to some embodiments of the present invention.

FIG. 4 is a simplified schematic diagram illustrating a pre-charge circuit for an output driver in an audio system according to some embodiments of the present invention. Pre-charge circuit 400 is an example of a pre-charge circuit that can be used as pre-charge circuit 230 in audio driver 200 illustrated in FIG. 2 or pre-charge circuits 300 or 350 of FIG. 3. FIG. 4 shows a pre-charge circuit 400 including a charging amplifier 410 and a feedback bias circuit 420. FIG. 4 also shows two switches, S1 and S2. Switch S1 is used to couple to a load, for example, a speaker, which is represented by a capacitor load 440 with a capacitance $C_L$. Switch S2 is used to set the initial state of voltage Vo to ground. Two connection options are shown, OUTN or OUTP.

As shown in FIG. 4, charging amplifier 410 includes an output node 412 for coupling to capacitive load 440, a first input node 414 for receiving a reference voltage, e.g., VCM, a second input node 416 for coupling to the output node of the charging amplifier. Charging amplifier 410 also has a bias node 418 for receiving a bias current $I_{bias}$, wherein an output voltage Vo of the charging amplifier 410 varies with the bias current $I_{bias}$.

In FIG. 4, feedback bias circuit 420 includes a first current source 421 and a second current source 431. First current source 421 includes a first transistor 422, a feedback amplifier 423, and a resistor 429. Feedback amplifier 423 includes an output node 424 coupled to a gate 425 of the first transistor 422, a first input node 426 for coupling to the output node 412 of the charging amplifier 410, and a second input node 427 for coupling to a source 428 of the first transistor 422. Resistor 429 is coupled to the source 428 of the first transistor 422. The first current source 421 is configured to provide a first current I1 that varies with the output voltage Vo of the charging amplifier 410. The second current source 431 provides a reference current I2, which is an initial current. Feedback bias circuit 420 also includes a summing circuit 432 including a first current mirror, made up of transistors M1 and M2, and second current mirror, made up of transistors M3 and M4, for providing a bias current $I_{bias}$. Bias current $I_{bias}$ represents a sum of the first current I1 and the second current I2. The summing circuit 432 is coupled to the bias node 418 of the charging amplifier 410 for providing the bias current $I_{bias}$ to the charging amplifier 410.

FIG. 4 shows an embodiment of an auto-tracking and self-bias circuit for Vout pre-charge control. Initially, a reset switch S2 (rst) is on, and the voltage Vo is pulled to ground. To start the pre-charge, the reset switch S2 is turned off. The feedback amplifier—423 has a deliberate input offset introduced such that the NMOS transistor 422 is turned-off and biased in the cut-off region. The current through transistor 422 is set by Vo/R, where R is the resistance of programmable resistor 429. In some embodiments, with a two-bit programming code, the resistance R can have four values. In one embodiment, a resistance value 60KΩ to 75KΩ is chosen. Embodiments with resistor trimming allows finer granularity to set the first current I1 through transistor 422 to set different rise times for the output voltage.

In one scenario, initially, at time t=0+, the reset switch S2 (rst) is turned off and charging switch S1 is turned on, and amplifier 410 starts to slowly charge the voltage Vo towards VCM—the common mode voltage. The first current I1, which is initially close to zero, starts to increase through transistor 422. The current I1 is mirrored through PMOS transistors M3 and M4, and adds to the source current I2 of PMOS transistor M2. Hence, as the output voltage Vo rises, the current I1 will also continue to increase. Current I2 determines the initial step in the charging. In some embodiments, the feedback amplifier 423 can have programmable input offset trim to achieve the desired offset to bias transistor 422. In some embodiments, the pre-charge target voltage, the VCM voltage, can also be made programmable, for example, to compensate for power supply variation.

Referring to FIG. 4, the bias current $I_{bias}$ flowing into the bias node 418 of charging amplifier 410 can be expressed as follows.

$$Ibias = I1 + I2 = \frac{Vo}{R} + I2$$

Figure 5:
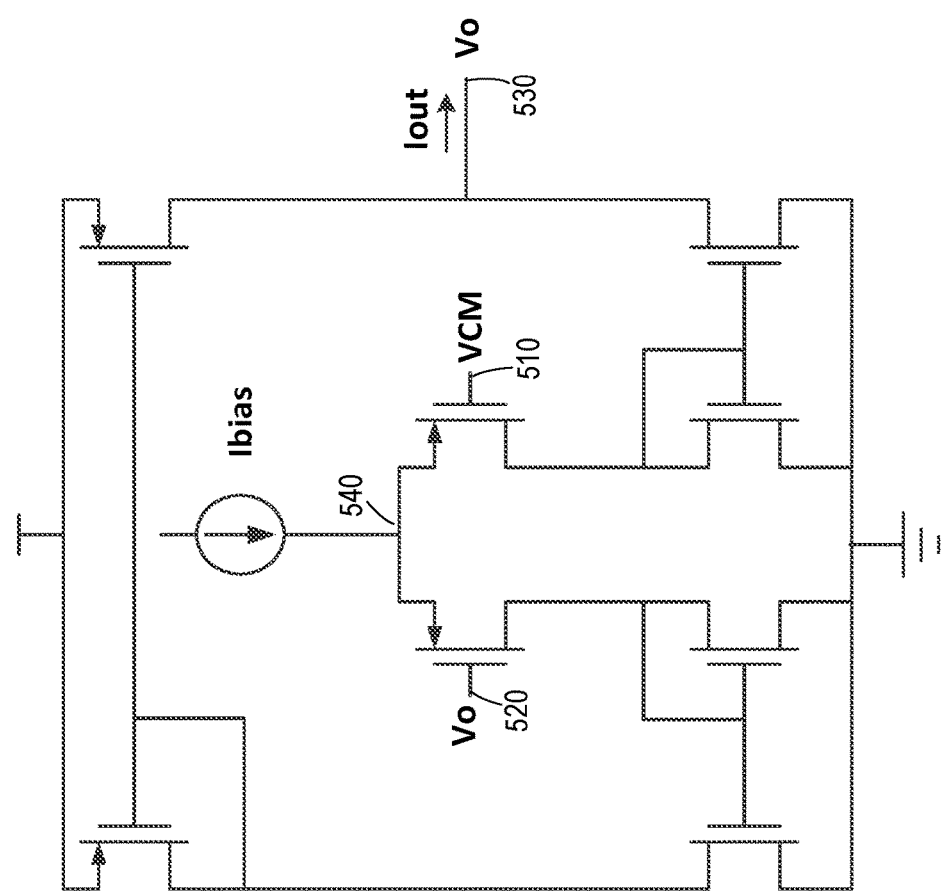
FIG. 5 is a schematic diagram of an operational amplifier that can be used in the pre-charge circuit of FIG. 4 according to some embodiments of the present invention.

In some embodiments, the charging amplifier 410, with its input bias current, Ibias, can be represented as shown in FIG. 5.

As an example of the operation of pre-charge circuit 400 of FIG. 4, the initial current I2 is pre-set at 750 nA. Current I1 (Vo/R) continues to increase as the feedback amplifier 421 senses and tracks the increase in the output voltage Vo of charging amplifier 410. As a result, the output voltage increases in a smooth and controlled manner such that it can minimizes any pop and click noise during the charging process.

FIG. 5 is a schematic diagram of an operational transconductance amplifier that can be used in the pre-charge circuit of FIG. 4 according to some embodiments of the present invention. As shown in FIG. 5, amplifier 500 is an example of an amplifier that can be used as the charging amplifier 410 in FIG. 4. Amplifier 500 includes an output node 530 for coupling to a capacitive load (not shown), a first input node 510 for receiving a reference voltage (VCM), and a second input node 520 for coupling to the output node 530 of amplifier 500. Amplifier 500 also includes a bias node 540 for receiving a bias current $I_{bias}$. It can be seen that an output current Iout of the amplifier 500 varies with the bias current $I_{bias}$. Amplifier 500 also includes several transistors forming current mirrors. Their functions are not described in detail here.

Figure 6A:
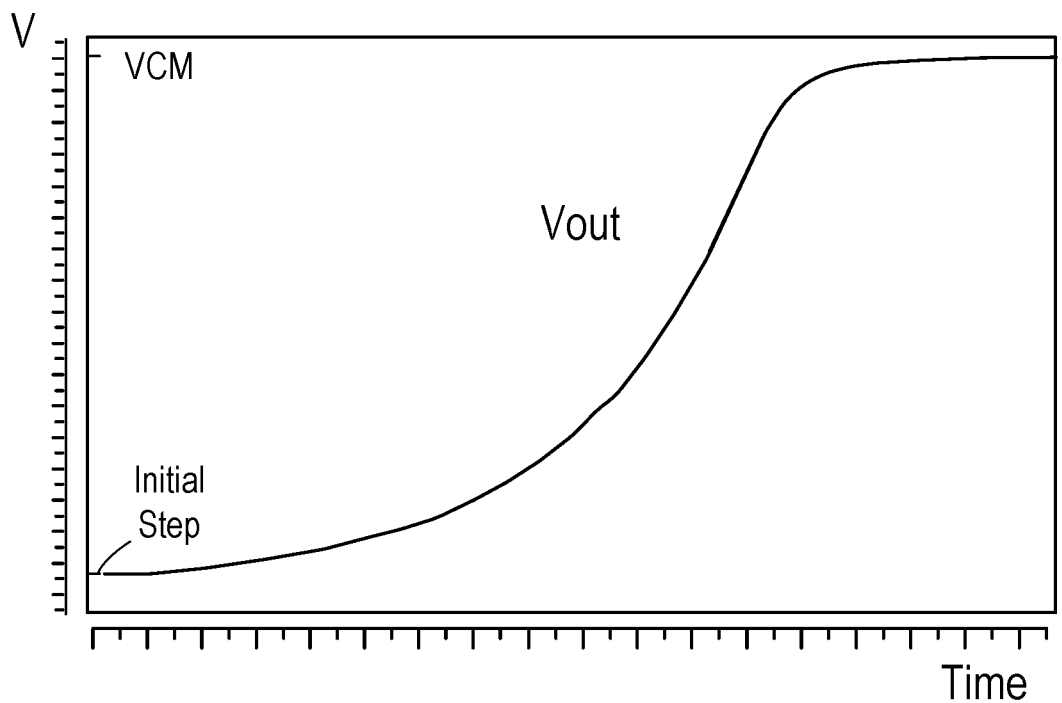
FIGS. 6A and 6B illustrate plots of current and voltage in the pre-charge circuit of FIG. 4 according to some embodiments of the present invention.
Figure 6B:
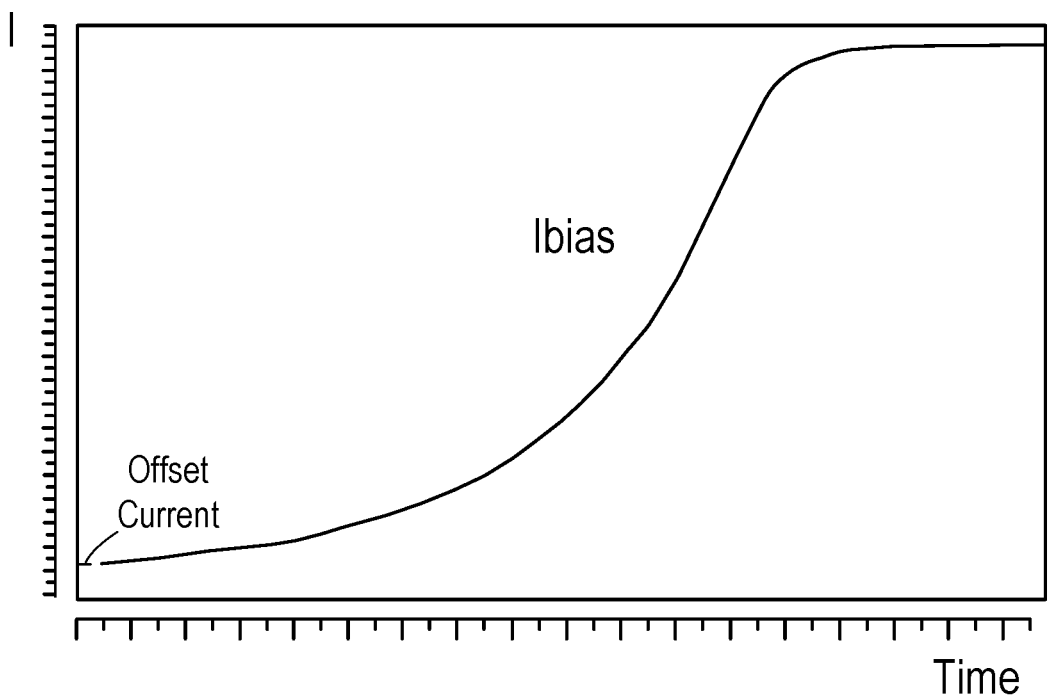

FIGS. 6A and 6B illustrate plots of the output current and voltage in the pre-charge circuit of FIG. 4 according to some embodiments of the present invention. FIG. 6A shows simulated output voltage Vout of the charging amplifier 410 in FIG. 4 as a function of time. Vout is charged toward VCM, which is approximately 1.65V in this example with a 3.3V power supply. FIG. 6B shows simulated bias current $I_{bias}$ in FIG. 4 as a function of time. It can be seen that the output voltage at the output node varies with the bias current. Further, at the beginning of the charging operation, t=0, the initial value of bias current $I_{bias}$ is determined by the initial current I2 in FIG. 4. As shown in FIG. 6A, the initial value of $I_{bias}$ can be selected to be low to get a low voltage step in Vout.

FIG. 7 illustrates a table of performance data based on a simulation for the pre-charge circuit of FIG. 4. FIG. 7 shows the results of the simulation of pre-charge circuit for typical operating conditions (27° C., 3.3V). The simulation was for resistance values of the programmable resistor R in the feedback bias circuit varying from 60KΩ to 75KΩ as selected by a two-bit code Ib<1:0>. The capacitive loading, CL, on outputs OUTN and OUTP, was 1 µF. The total harmonic distortion (THD) measured is approximately −91 dB with an average rise time of 225 mS to reach 90% of the final VCM value. Typically, it is desirable to achieve a THD for pop/click noise suppression of −80 dB or better. It can be seen that the total harmonic distortion (THD) of −91 dB for the pre-charge circuit described above is substantially better than typical standard of −80 dB.

Figure 8:
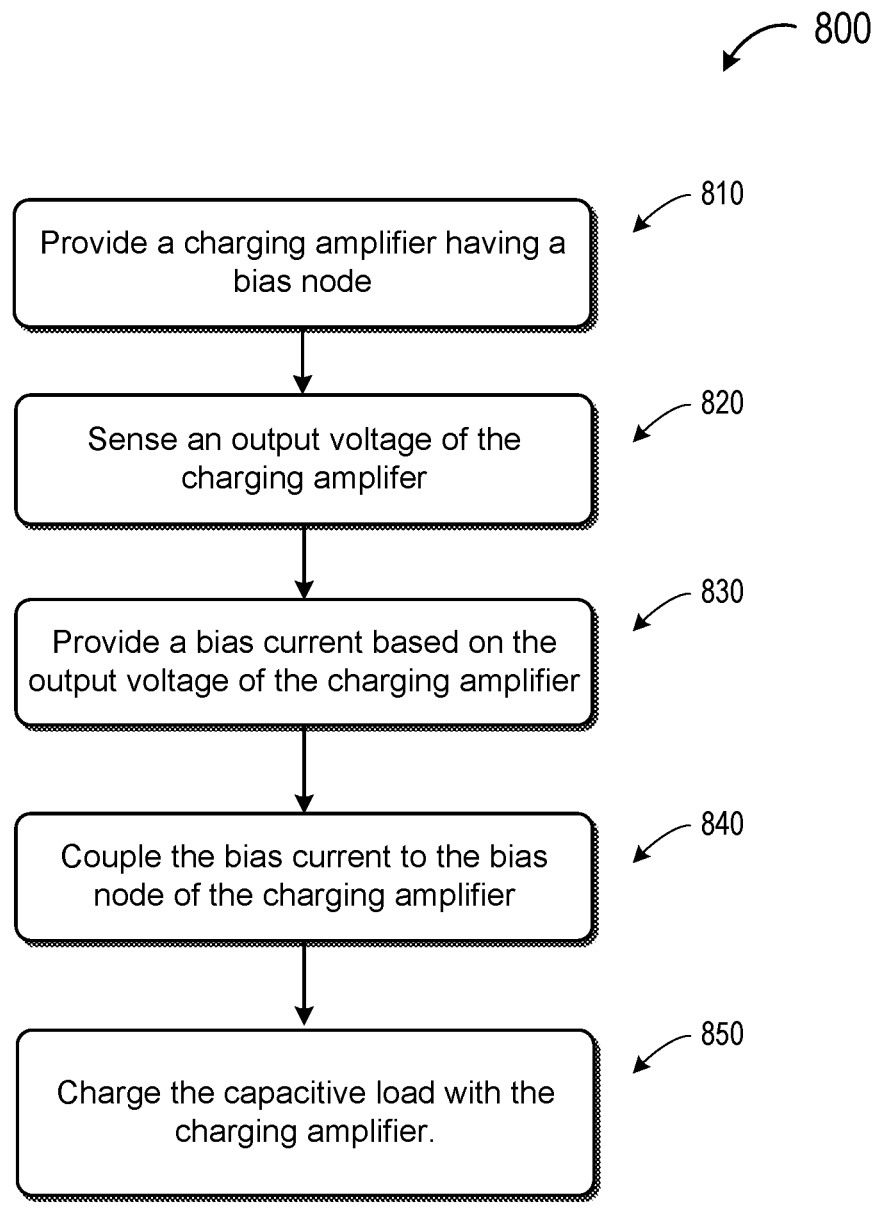
FIG. 8 is a simplified flowchart illustrating a method for pre-charging an output driver in an audio system according to some embodiments of the present invention.

FIG. 8 is a simplified flowchart illustrating a method for pre-charging an output driver in an audio system according to some embodiments of the present invention. An example of the output driver is described above in connection with FIG. 2. Examples of pre-charge circuits implementing the method of FIG. 8 are described above in connection with FIGS. 3-5. As shown in FIG. 8, method 800 for pre-charging an output driver includes, at 810, providing a charging amplifier, such as charging amplifier 410 in FIG. 4. The charging amplifier includes an output node for coupling to a capacitive load, a first input node for receiving a reference voltage, a second input node for coupling to the output node of the charging amplifier, and a bias node for receiving a bias current. In some embodiments, the output current in the charging amplifier varies with the bias current, as described above in connection with FIGS. 4 and 5.

At 820, the method includes sensing an output voltage of the charging amplifier. In some embodiments, sensing the output voltage of the charging amplifier includes using a feedback bias circuit to sense the output voltage, such as described above in connection with FIG. 4. The method includes providing a feedback amplifier, coupling a first input node of a feedback amplifier to the output node of the charging amplifier, coupling a second input node of the feedback amplifier to a source of a first transistor, and coupling an output node of the feedback amplifier to a gate of the first transistor.

At 830, the method includes providing a bias current based on the output voltage of the charging amplifier. In some embodiments, providing a bias current includes providing a first current by coupling a source node of the first transistor to a resistor. In some embodiments, providing the bias current also includes providing a second current that is a programmable current.

At 840, the method includes coupling the bias current to the bias node of the charging amplifier to provide the bias current, which varies with the output voltage. The method can further include coupling the second current to the bias node of the charging amplifier to provide an initial charging voltage step.

At 850, the method includes charging the capacitive load with the output voltage of the charging amplifier. FIGS. 6 and 7 illustrate simulated results showing a smooth pre-charging of a capacitive load and reduction of pop and click noises.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Certain embodiments have been described. However, various modifications to these embodiments are possible, and the principles presented herein may be applied to other embodiments as well. In addition, the various components and/or method steps/blocks may be implemented in arrangements other than those specifically disclosed without departing from the scope of the claims. Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. An output driver for an audio system, comprising:
    a driving amplifier circuit for driving a capacitive load; and
    a pre-charge circuit for pre-charging the capacitive load to a common mode voltage;
    wherein the pre-charge circuit comprises:
    a charging amplifier, including:
        an output node for coupling to a capacitive load;
        a first input node for receiving a reference voltage;
        a second input node for coupling to the output node of the charging amplifier; and
        a bias node for receiving a bias current, wherein an output current of the charging amplifier varies with the bias current; and
    a feedback bias circuit, including:
        a first current source, including:
            a first transistor;
            a feedback amplifier, including:
                an output node coupled to a gate of the first transistor;
                a first input node for coupling to the output node of the charging amplifier; and
                a second input node for coupling to a source of the first transistor; and
            a resistor for coupling to the source of the first transistor,
            wherein the first current source is configured to provide a first current that varies with an output voltage of the charging amplifier;
        a second current source for providing a second current; and
        a summing circuit including first and second current mirrors for providing a bias current that represents a sum of the first current and the second current, wherein the summing circuit is coupled to the bias node of the charging amplifier for providing the bias current to the charging amplifier.

2. The output driver of claim 1, wherein the feedback amplifier has a pre-set input offset configured to bias the first transistor weakly-on in a sub-threshold region.

3. The output driver of claim 1, wherein the output voltage of the charging amplifier varies proportionally to the bias current.

4. The output driver of claim 1, wherein the resistor is a programmable resistor configured to set the bias current of the charging amplifier in accordance with the capacitive load and desired rise time.

5. The output driver of claim 1, further comprising a switch circuit configured to couple the output node of the charging amplifier to either the capacitive load or a ground node.

6. The output driver of claim 1, wherein the charging amplifier and the feedback amplifier are operational transconductance amplifiers.

7. The output driver of claim 1, wherein the second current is an initial current characterized by a magnitude selected to provide an initial step of charging current.

8. An output driver for an audio system, comprising:
a pre-charge circuit, wherein the pre-charge circuit comprises:
a charging amplifier comprising an operational transconductance amplifier, including:
an output node for coupling to a capacitive load;
a first input node for receiving a reference voltage;
a second input node for coupling to the output node of the charging amplifier; and
a bias node for receiving a bias current, wherein an output current of the charging amplifier varies with the bias current; and
a feedback bias circuit, coupled to the output node to sense an output voltage of the charging amplifier, and configured to provide the bias current that varies with the output voltage of the charging amplifier.

9. The output driver of claim 8, wherein the feedback bias circuit comprises:
a first current source, including:
a first transistor;
a feedback amplifier, including:
an output node coupled to a gate of the first transistor;
a first input node for coupling to the output node of the charging amplifier; and
a second input node for coupling to a source of the first transistor; and
a resistor for coupling to the source of the first transistor, wherein the first current source is configured to provide a first current that varies with the output voltage of the charging amplifier.

10. The output driver of claim 9, wherein the feedback bias circuit further comprises:
a second current source for providing a second current; and
a summing circuit including first and second current mirrors for providing a bias current that represents a sum of the first current and the second current, wherein the summing circuit is coupled to the bias node of the charging amplifier for providing the bias current to the charging amplifier;
wherein the pre-charge circuit is configured to provide an output current to the capacitive load at the output node of the charging amplifier, the output current varying with the output voltage at the output node.

11. The output driver of claim 10, wherein the second current is an initial current characterized by a magnitude selected to provide an initial step of charging current.

12. The output driver of claim 9, wherein the feedback amplifier has a pre-set input offset configured to bias the first transistor weakly-on in a sub-threshold region.

13. The output driver of claim 9, wherein the resistor is a programmable resistor configured to set the bias current of the charging amplifier in accordance with the capacitive load and desired rise time.

14. The output driver of claim 8, wherein an output current of the charging amplifier varies with the bias current.

15. The output driver of claim 8, further comprising a switch circuit configured to couple the output node of the charging amplifier to either the capacitive load or a ground node.

16. A method for pre-charging an output driver in an audio system, the method comprising:
providing a charging amplifier, the charging amplifier including an output node for coupling to a capacitive load, a first input node for receiving a reference voltage, a second input node for coupling to the output node of the charging amplifier, and a bias node for receiving a bias current;
sensing an output voltage of the charging amplifier;
providing a first current based on the output voltage of the charging amplifier;
coupling the first current to the bias node of the charging amplifier to provide the bias current, which varies with the output voltage; and
charging the capacitive load with the output voltage of the charging amplifier;
wherein sensing the output voltage of the charging amplifier comprises:
providing a feedback amplifier;
coupling a first input node of a feedback amplifier to the output node of the charging amplifier;
coupling a second input node of the feedback amplifier to a source of a first transistor; and
coupling an output node of the feedback amplifier to a gate of the first transistor.

17. The method of claim 16, wherein providing the first current comprises coupling a source node of the first transistor to a resistor.

18. The method of claim 16, further comprising providing a second current that is a programmable current.

19. The method of claim 18, further comprising coupling the second current to the bias node of the charging amplifier to provide an initial charging voltage step.

* * * * *